(12) United States Patent
Arai et al.

(10) Patent No.: US 6,479,788 B1
(45) Date of Patent: Nov. 12, 2002

(54) METHOD AND APPARATUS OF MAKING A HOLE IN A PRINTED CIRCUIT BOARD

(75) Inventors: Kunio Arai, Atsugi; Hiroshi Aoyama, Tokyo; Hideo Ueno, Yamato, all of (JP)

(73) Assignee: Hitachi Via Mechanics, Ltd., Ebina (JP)

( * ) Notice: Subject to any disclaimer, the term of this patent is extended or adjusted under 35 U.S.C. 154(b) by 0 days.

(21) Appl. No.: 09/577,888

(22) Filed: May 25, 2000

(51) Int. Cl.[7] .............................................. B23K 26/36
(52) U.S. Cl. ................................................ 219/121.71
(58) Field of Search ....................... 219/121.67, 121.68, 219/121.69, 121.7, 121.71, 121.72, 121.85

(56) References Cited

U.S. PATENT DOCUMENTS

| | | | | |
|---|---|---|---|---|
| 5,010,232 A | * | 4/1991 | Arai et al. ................ | 219/121.7 |
| 5,063,280 A | * | 11/1991 | Inagawa et al. ......... | 219/121.7 |
| 5,073,687 A | | 12/1991 | Inagawa et al. | |
| 5,841,099 A | * | 11/1998 | Owen et al. ............ | 219/121.71 |
| 5,939,010 A | * | 8/1999 | Yuyama et al. ......... | 219/121.71 |
| 6,043,453 A | * | 3/2000 | Arai ....................... | 219/121.73 |
| 6,201,213 B1 | * | 3/2001 | Sawai et al. ............ | 219/121.71 |

FOREIGN PATENT DOCUMENTS

| | | |
|---|---|---|
| JP | 3-27885 | 2/1991 |
| JP | 3-142087 | 7/1991 |
| JP | 5-55724 | 5/1993 |

\* cited by examiner

*Primary Examiner*—Samuel M. Heinrich
(74) *Attorney, Agent, or Firm*—Crowell & Moring LLP

(57) ABSTRACT

The invention provides a method and an apparatus of making a hole in a printed circuit board, which improve the quality of a hole shape and the processing speed. In accordance with the invention, a control apparatus controls a laser oscillator and a galvano mirrors so as to form a hole while gradually reducing a pulse width in each step with respect to one hole. As a result of this, no insulating material is left on the bottom portion of the hole, and it is possible to make a hole having an intended shape, particularly, having a desired diameter of the hole bottom.

3 Claims, 11 Drawing Sheets

METHOD AND APPARATUS OF MAKING A HOLE IN A PRINTED CIRCUIT BOARD

BACKGROUND OF THE INVENTION

1. Field of the Invention

The present invention relates to a method and an apparatus for forming a hole, in particular, a blind hole in a printed circuit board by a laser beam.

2. Description of the Prior Art

The burst processing method and the cycle processing method, which are known as a method of making a hole in a printed circuit board by a laser beam, will be described with reference to the accompanying drawings.

FIG. 7 is a view for explaining the operation based on the burst processing method, and FIG. 8 is a cross sectional view of the formed hole thereby. In the burst processing method, as shown in FIG. 7, after positioning a laser beam at a hole forming position on a printed circuit board in accordance with a processing program, N pulses (N=1, 2, 3, ..., n) of beams, which have a definite width of pulse $W_C$ (ms), a definite peak output $P_C$ (W) and a definite period of pulse $T_C$ (ms), enough to form a hole are shot continuously. For example, in case of continuously shooting three pulses (N=3) of beams on a printed circuit board comprising a resin in 50–100 μm thickness, a hole having an inlet diameter $D_{T1}$ and a bottom diameter $d_{B1}$ is formed by a first pulse, and thereafter the hole is made into a hole having an inlet diameter $D_{T2}$ and a bottom diameter $d_{B2}$ by a second pulse, and finally into a hole having an inlet diameter $D_{T3}$ and a bottom diameter $d_{B3}$ by a third pulse, as shown in FIG. 8. That is, the printed circuit board is processed so that the hole bottom is gradually expanded. In this case, when a positioning time is set as $T_G$ (ms), the following formulas are established.

Pulse Energy: $E_C(mJ)=W_C \times P_C$ (1)

Total Energy Per One Hole: $E_N(mJ)=E_C \times N$ (2)

Processing Period Per One Hole:

$T_D(ms)=T_G+T_C \times (N-1)+W_C$ (3)

FIG. 9 is a view for explaining the operation based on the cycle processing method, and FIG. 10 is a cross sectional view of the formed hole thereby. In the cycle processing method, as shown in FIG. 9, a single beam which has a definite width of pulse $W_C$ (ms) and a definite peak output $P_C$ (W) is shot at each of a plurality of hole forming positions in accordance with a processing program for forming a hole in progress. Subsequently, the program is repeated for a plurality of cycles (N cycles) until a required hole shape is formed, so that the required holes are formed. For example, in case of forming a hole so as to gradually expand the hole bottom by repeatedly applying the process for three cycles to a printed circuit board comprising a resin in 50–100 μm thickness, a hole having an inlet diameter $D_{t1}$ and a bottom diameter $d_{b1}$ is formed by the pulse in a first cycle, and thereafter the hole is made into a hole having an inlet diameter $D_{t2}$ and a bottom diameter $d_{b2}$ by the pulse in a second cycle, and finally into a hole having an inlet diameter $D_{t3}$ and a bottom diameter $d_{b3}$ by the pulse in a third cycle, as shown in FIG. 10. As is apparent from the description mentioned above, pulse energy $E_C$ and total energy $E_N$ per one hole in the cycle processing method are the same as those of the burst processing method, however, a processing period $T_D$ per one hole is expressed by the following formula (4).

$T_D(ms)=(T_G+W_C) \times N$ (4)

As mentioned above, in both of the burst processing method and the cycle processing method, the shorter the beam positioning time $T_G$ and the pulse period $T_C$ is, or the smaller the number N of pulse shot is, the faster the hole forming speed becomes. However, in the cycle processing method, since the hole to be shot is different at every one pulse, there is a disadvantage that the hole forming speed is reduced to almost 1/N in the case that the number of cycle becomes large. For example, in case of using a galvano mirror for positioning the beam, the practical positioning period of the beam is about 2 ms (frequency 500 Hz). Moreover, the pulse period capacity of an oscillator is about 0.5 ms (the frequency of 2000 Hz). Furthermore, taking the hole quality into consideration, three pulses per one hole are required in the case that the pulse width is 15 μs and the pulse period is 2 to 1 ms (the frequency of 500 to 1000 Hz). Accordingly, the practical processing period per one hole in the burst processing method is 6.02 to 4.02 ms (the hole forming speed is 166 to 248 holes per second). On the contrary, the hole forming period in the cycle processing method is 6.05 ms (the hole forming speed is 165 holes per second).

SUMMARY OF THE INVENTION

In case of the burst processing method, if the pulse period $T_C$ is reduced in order to increase the processing speed, plasma will be easily generated in a hole by the second pulse or the pulse thereafter, since decomposed materials are exposed by the following beam without being sufficiently scattered. If the plasma is generated, a wall surface of the hole is formed in a barrel shape, that is, a center portion of the hole in the depth direction is expanded in the diametrical direction, so that the hole can not be formed in a tapered shape, or the energy becomes in short for a decomposition threshold because of the energy loss due to the generation of the plasma, so that the hole is only carbonized and can not be expand. Accordingly, depending on materials, it may be necessary to increase the pulse period to 5 ms, and reduce the pulse width to 15 μs for increasing the number of shot by one or two shot. In this case, the processing speed is widely reduced. Further, if increasing the pulse width $W_C$ for improving the processing speed, although the residual resin debris in the hole bottom is reduced, the energy is consumed for increasing the temperature of the inner layer and the periphery of the hole, so that the quality of the hole is bastardized. Further, since the energy reaching a copper foil surface of the hole bottom increases rapidly, the temperature increase of the hole bottom becomes high, so that there is a case of melting the inner layer copper foil or melting out to pass through the foil.

On the contrary, in case of the cycle processing method, since the pulse period with respect to one hole is sufficiently long, and the hole forming by the following pulse is performed after the decomposed materials generated by the first pulse are sufficiently scattered, the plasma is less generated in the hole in comparison with the burst processing, the hole shape is better than that of the burst processing method, and a barrel-shaped inner wall of the hole and an inferiority of the hole quality due to the insufficiency of energy are less generated. Further, since the diffusion of heat is improved and the temperature increase is reduced, the melt and the passing-through of the inner layer copper foil are reduced.

However, the processing speed is low. Then, even in the cycle processing method, as shown in FIG. 11, there is a case that the curved resin is left in the side close to the hole bottom although it is intended to form the diameter of the bottom portion into $d_{B4}$ (or $d_{b4}$), so that the inferior plating is generated in the later step or it is impossible to secure an area for turning on electricity.

An object of the present invention is to provide a method and an apparatus of making a hole in a printed circuit board, which can solve the problems mentioned above, and improve the quality of the hole shape and the processing speed.

In order to achieve the object, in accordance with the present invention, there is provided a method of making a hole in a printed circuit board, comprising a first step of forming a hole reaching a bottom, a second step of expanding the diameter of the hole bottom, and a third step of finishing an end portion of the hole bottom. Moreover, in accordance with the present invention, the laser beam energy in the second step may be smaller than the laser beam energy in the first step and the laser beam energy in the third step is smaller than the laser beam energy in the second step. Furthermore, the laser beam energy may be changed in each of said steps by changing the pulse width while fixing the peak output value of the laser beam. It is not necessary to employ the same processing method in each of the steps, for example, the cycle processing may be performed in the first and second steps and the burst processing may be performed in the third step.

In accordance with another aspect of the present invention, there is provided an apparatus of making a hole in a printed circuit board, which has a control apparatus for performing the control mentioned above. The control may be achieved by controlling a laser beam oscillator and a galvano mirror.

DESCRIPTION OF THE PREFERRED EMBODIMENTS

Figure 1:
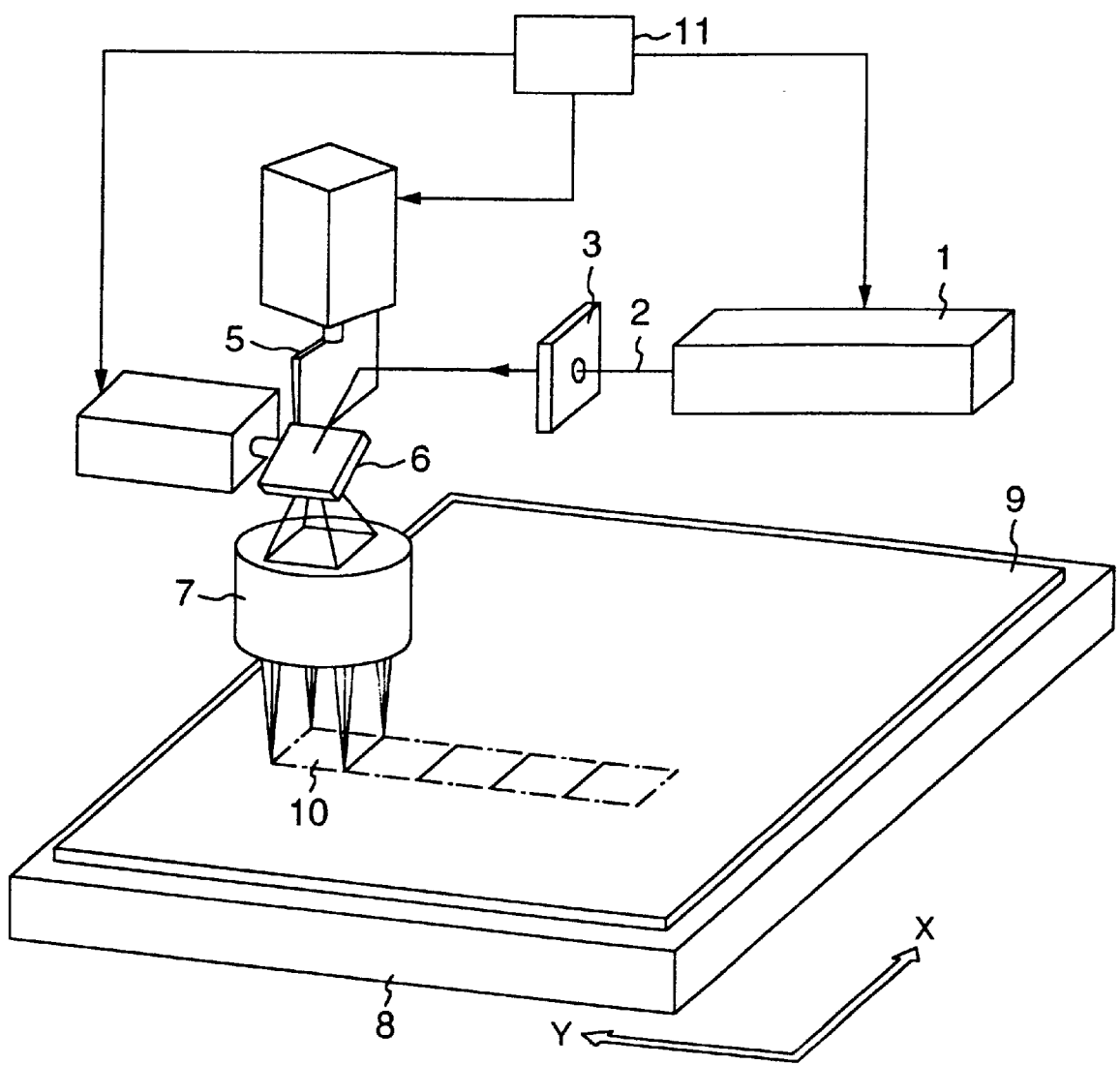
FIG. 1 shows a structure of an apparatus of making a hole for a printed circuit board in accordance with an embodiment of the present invention.

In FIG. 1, reference numeral 1 denotes a laser oscillator, reference numeral 2 denotes a laser beam, reference numeral 3 denotes an aperture for controlling a diameter, reference numerals 5 and 6 denote galvano mirrors, reference numeral 7 denotes a telecentric type of fθ lens, reference numeral 8 denotes a X-Y machining table, reference numeral 9 denotes a printed circuit board, reference numeral 10 denotes a processing position, and reference numeral 11 denotes a control apparatus.

Next, the operation will be described. At first, a hole forming process is described. The laser beam 2 (hereinafter, refer to as a beam) emitted from the laser oscillator 1 passes through the aperture 3 and the galvano mirrors 5 and 6 positioned to have a predetermined turning angle by the angle conversion according to a processing program is converted into the direction parallel to the optical axis of the fθ lens 7 (namely, the vertical direction to the printed circuit board 9) by means of the fθ lens 7, and is projected in a compressed manner on the processing position 10 of the printed circuit board 9 set on the X-Y table 8, so as to make a hole. The above steps are repeated at a high speed (some hundreds points per second) and a high speed scanning process is performed. When the hole formation in a processing area f mm×θ radian (for example, 50 mm×50 mm) by the galvano mirror and the fθ lens is finished, the X-Y table moves to the next processing area in a step manner according to the processing program. These operations are subsequently repeated so as to process in all the area.

Figure 2:
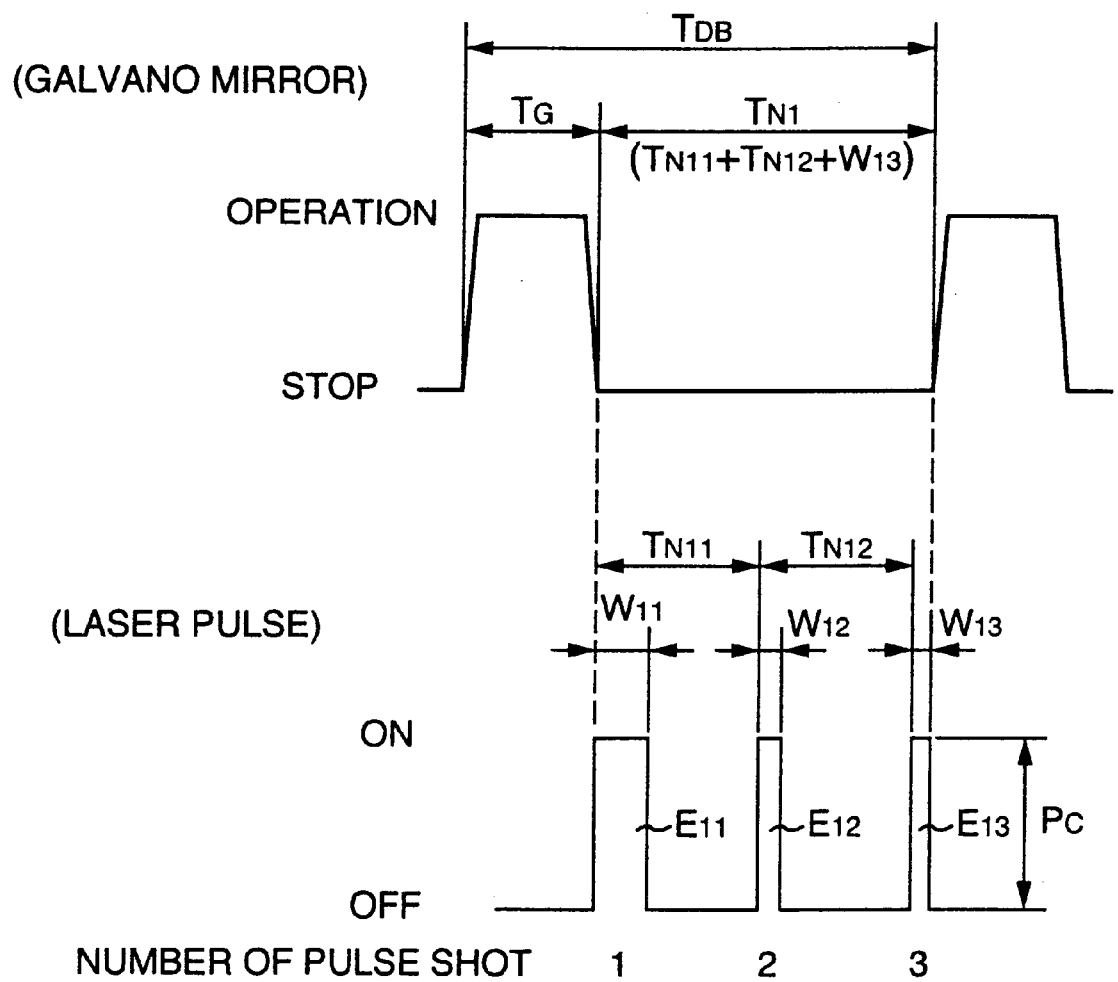
FIG. 2 is a view for explaining the operation in case of applying the present invention to the burst processing method.
Figure 3:
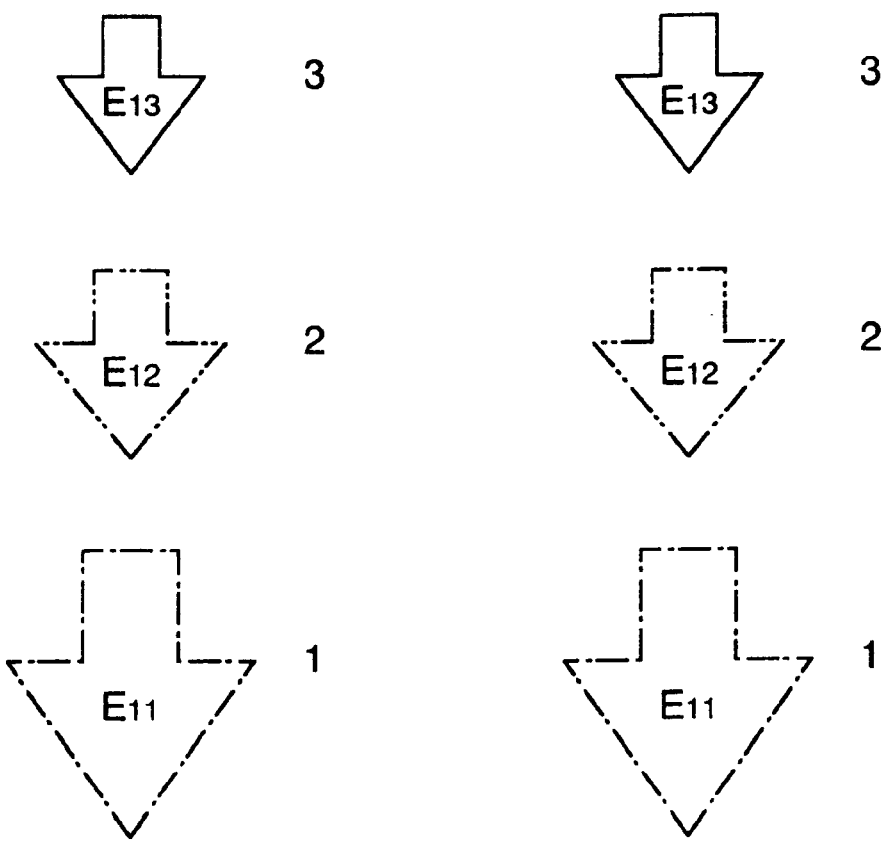
FIG. 3 is a cross sectional view of the formed hole in case of applying the present invention to the burst processing method.
Figure 3:
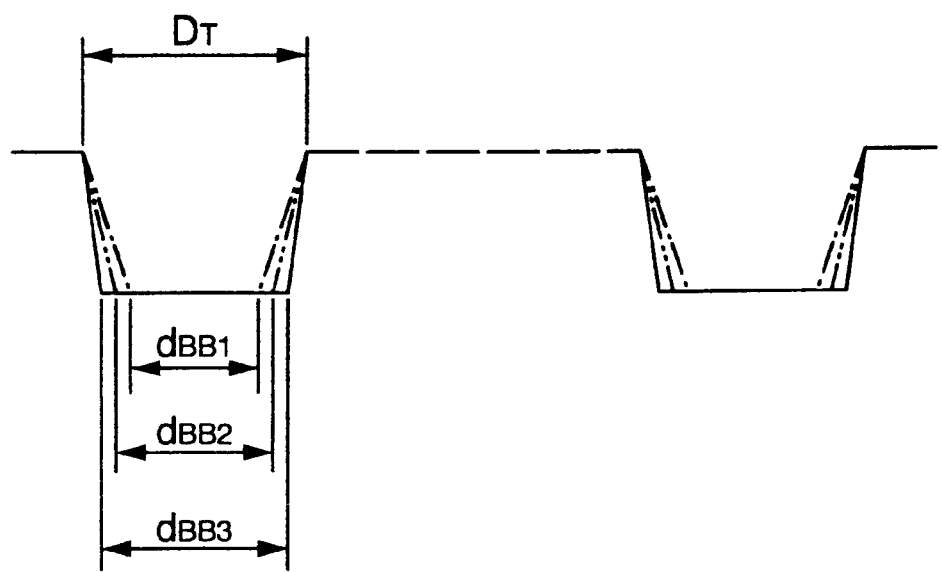

FIG. 2 is a view for explaining the operation in case of applying the present invention to the burst processing method, and FIG. 3 is a cross sectional view of the formed hole. After the control apparatus 11 positions the galvano mirrors 5 and 6 in accordance with the processing program (positioning time $T_G$ (ms)), the control apparatus 11, at first, emits N pulses of beams (N=1, 2, . . . ) having energy with a large pulse width, which corresponds to a first condition (having a pulse width of $W_{11}$ (ms), a peak output $P_C$ (W) and a pulse period $T_{11}$ (ms)), and forms a taper shaped hole having an inlet diameter $D_T$ and a bottom diameter $d_{BB1}$. Accordingly, pulse energy $E_{11}$ (mJ) of the first condition, total energy $E_{N11}$ (mJ) of the first condition and a processing period $T_{N11}$ (ms) of the first condition can be expressed by the following formulas 5–7.

$$E_{11}=W_{11} \times P_C \quad (5)$$

$$E_{N11}=E_{11} \times N \quad (6)$$

$$T_{N11}=T_{11} \times N \quad (7)$$

Subsequently, the pulse condition is changed to a second condition, M pulse of beam (M=1, 2, . . . ) having energy with a middle pulse width (a pulse width $W_{12}$ (ms), a peak output $P_C$ (W) and a pulse period $T_{12}$ (ms)) is emitted, and the hole bottom diameter is expanded to $d_{BB2}$ without damaging the hole inlet (having a diameter $D_T$) which is formed in accordance with the first condition. Accordingly, pulse energy $E_{12}$ (mJ) of the second condition, total energy $E_{N12}$ (mJ) of the second condition and a processing period $T_{N12}$ of the second condition (ms) can be expressed by the following formulas 8–10.

$$E_{12}=W_{12} \times P_C \quad (8)$$

$$E_{N12}=E_{12} \times M \quad (9)$$

$$T_{N12}=T_{12} \times M \quad (10)$$

Subsequently, the pulse condition is changed to a third condition, L pulses of beam (L=1, 2, . . . ) having energy with a small pulse width (a pulse width $W_{13}$ (ms), a peak output $P_C$ (W) and a pulse period $T_{13}$ (ms)) are emitted, and the hole bottom diameter is expanded to $d_{BB3}$ without damaging the hole inlet (having a diameter $D_T$) which is formed in accordance with the first condition. Accordingly, pulse energy $E_{13}$ (mJ) of the third condition, total energy $E_{N13}$ (mJ) of the third condition and a processing period $T_{N13}$ of the third condition (ms) can be expressed by the following formulas 11–12.

$$E_{13}=W_{13} \times P_C \tag{10}$$

$$E_{N13}=E_{13} \times L \tag{11}$$

$$T_{N13}=T_{13} \times (L-1)+W_{13} \tag{12}$$

Accordingly, a hole making period $T_{DB}$ (ms) and input energy $E_{NB}$ (mJ) per one hole can be expressed by the following formulas 13 and 14.

$$T_{DB}=T_G+T_{N11}+T_{N12}+T_{N13} \tag{13}$$

$$E_{NB}=E_{N11}+E_{N12}+E_{N13} \tag{14}$$

In this case, the relation $E_{N11} \geq E_{N12} \geq E_{N13}$ is established because of the relation $T_{N11} \geq T_{N12} \geq T_{N13}$.

After forming the first hole in the manner mentioned above, the galvano mirrors 5 and 6 are positioned to the next processing position and the other holes are subsequently processed in the same manner as that mentioned above.

Figure 4:
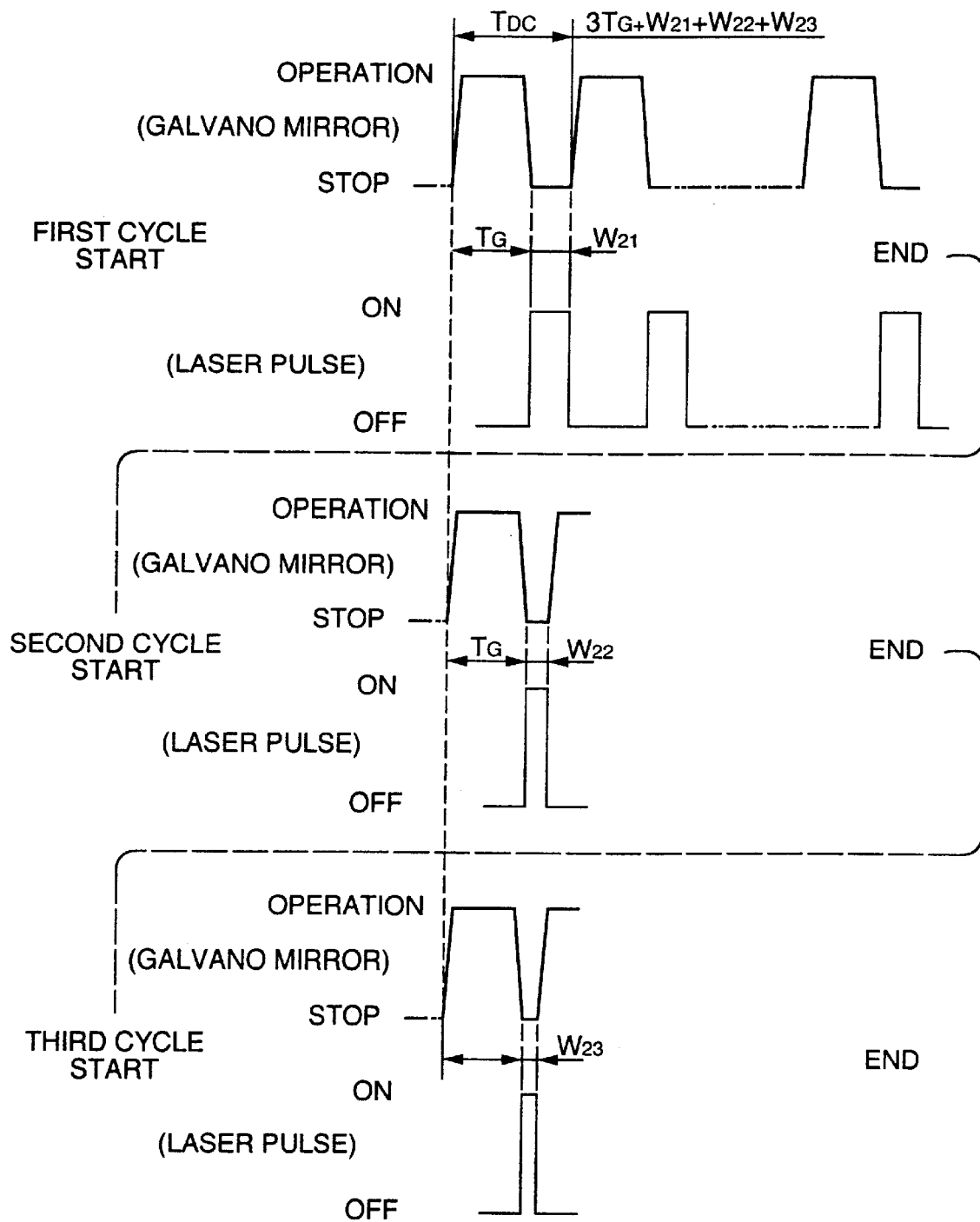
FIG. 4 is a view for explaining the operation in case of applying the present invention to the cycle processing method.
Figure 5:
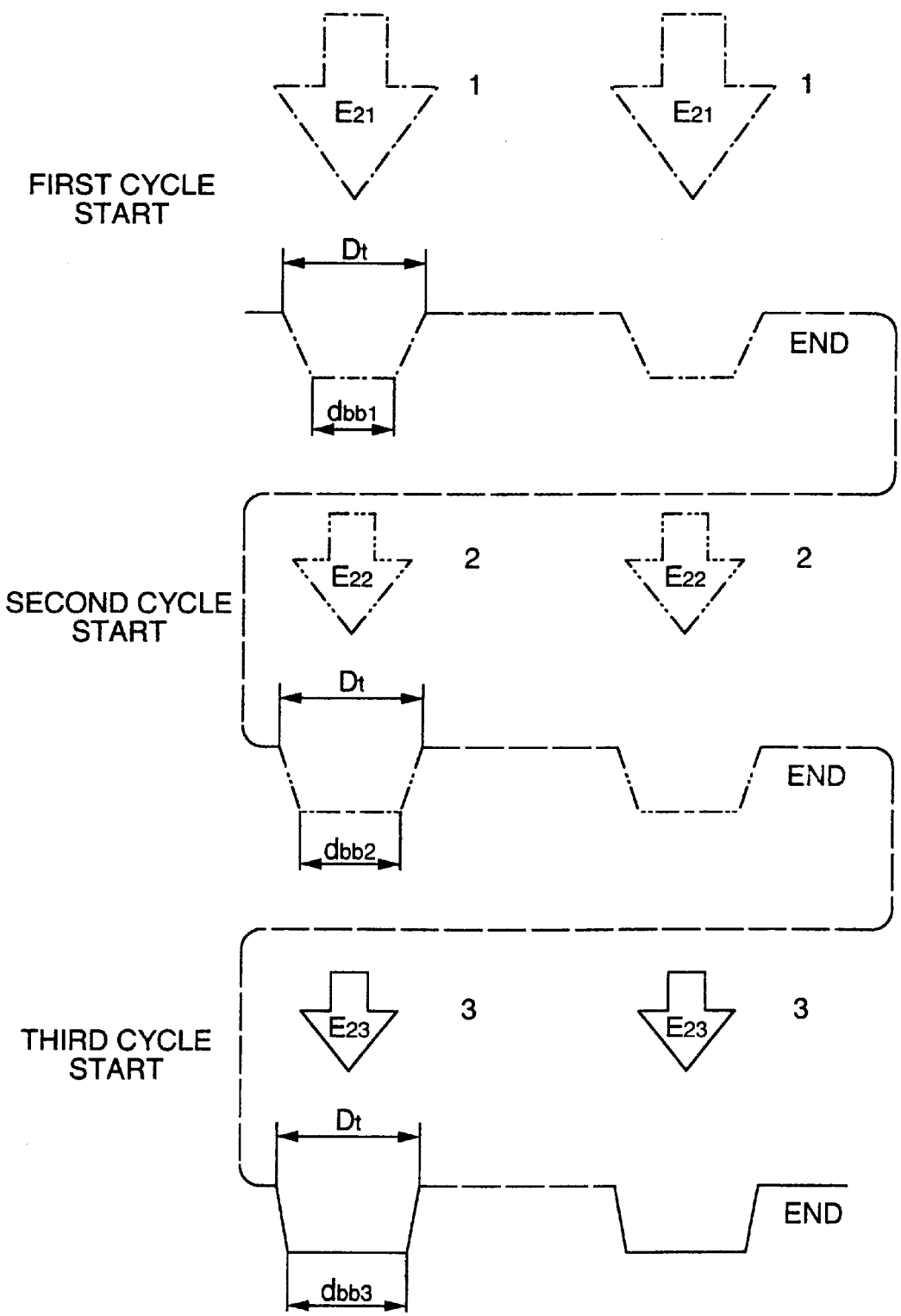
FIG. 5 is a cross sectional view of the formed hole in case of applying the present invention to the cycle processing method.

FIG. 4 is a view for explaining the operation in the case of applying the present invention to the cycle processing method, and FIG. 5 is a cross sectional view of the formed hole showing a processing step. In this embodiment, when positioning the galvano mirrors 5 and 6 (positioning time $T_G$ (ms)) in accordance with the processing program, at first a high energy beam having a large pulse width with a pulse width of $W_{21}$ (ms) and a peak output $P_C$ (W), as a first condition, is emitted at one time so as to form a taper hole having an inlet diameter $D_t$ and a bottom diameter $d_{bb1}$. Next, the beam is positioned with respect to the other hole in accordance with the processing program, and the pulse emission under the first condition is performed. The process mentioned above is performed to all holes in one cycle, and the cycle is performed N times (N=1,2, . . . ). Accordingly, pulse energy $E_{21}$ (mJ) of the first condition, total energy $E_{N21}$ (mJ) of the first condition and a processing period $T_{N21}$ of the first condition (ms) can be expressed by the following formulas 15–17.

$$E_{21}=W_{21} \times P_C \tag{15}$$

$$E_{N21}=E_{21} \times N \tag{16}$$

$$T_{N21}=T_C \times W_{21} \tag{17}$$

Subsequently, after positioning the galvano mirrors 5 and 6 (positioning time $T_G$ (ms)), a beam having a middle pulse width $W_{22}$ (ms) and a peak output PC (W), corresponding to a second condition, is emitted at one time and the taper shaped hole having an inlet diameter $D_t$ and a hole bottom diameter $d_{bb1}$ is expanded into a hole bottom diameter $d_{bb2}$ without damaging the hole inlet (having a diameter $D_t$). Then, the cycle, in which the positioning of the beam and the pulse emission in the second condition are applied to all holes according to. the processing program, is performed M times (M=1, 2, . . . ). Accordingly, pulse energy $E_{22}$ (mJ) of the second condition, total energy $E_{N22}$ (mJ) of the second condition and a processing period $T_{N22}$ of the second condition (ms) can be expressed by the following formulas 18–20.

$$E_{22}=W_{22} \times P_C \tag{18}$$

$$E_{N22}=E_{22} \times M \tag{19}$$

$$T_{N22}=T_G \times W_{22} \tag{20}$$

Further, subsequently, after positioning the galvano mirrors 5 and 6 (positioning time $T_G$ (ms)), a beam having a small pulse width $W_{23}$ (ms) and a peak output $P_C$ (W), corresponding to a third condition, is emitted at one time and the hole bottom diameter $d_{bb2}$ of the taper shaped hole is expanded to $d_{bb3}$ without damaging the hole inlet (having a diameter $D_t$). Then, the cycle, in which the positioning of the beam and the emission of the pulse in the third condition are applied to all holes according to the processing program, is performed L times (L=1, 2, . . . ).

Accordingly, pulse energy $E_{23}$ (mJ) of the third condition, total energy $E_{N23}$ (mJ) of the third condition and a processing period $T_{N23}$ of the third condition (ms) can be expressed by the following formulas 21–23.

$$E_{23}=W_{23} \times P_C \tag{21}$$

$$E_{N23} \text{ (mJ)}=E_{23} \times L \tag{22}$$

$$T_{N23} \text{ (ms)}=T_G \times W_{23} \tag{23}$$

Accordingly, a hole making period $T_{DC}$ (ms) and input energy $E_{NC}$ (mJ) per one hole can be expressed by the following formulas 24 and 25.

$$T_{DC}=T_{N21}+T_{N22}+T_{N23} \tag{24}$$

$$E_{NC}=E_{N21}+E_{N22}+E_{N23} \tag{25}$$

In this case, the relation $E_{N21} \geq E_{N22} \geq E_{N23}$ is established because of the relation $T_{N21} \geq T_{N22} \geq T_{N23}$.

In this case, N, M and L mentioned above are set to one or plural number, however, in the case that a resin thickness is between 50 and 100 $\mu$m, N, M and L may be generally set to 1, and in the case that a glass fiber reinforcing material is contained or a resin thickness is 100 $\mu$m or more, N, M and L are preferably set to 2.

Figure 6:
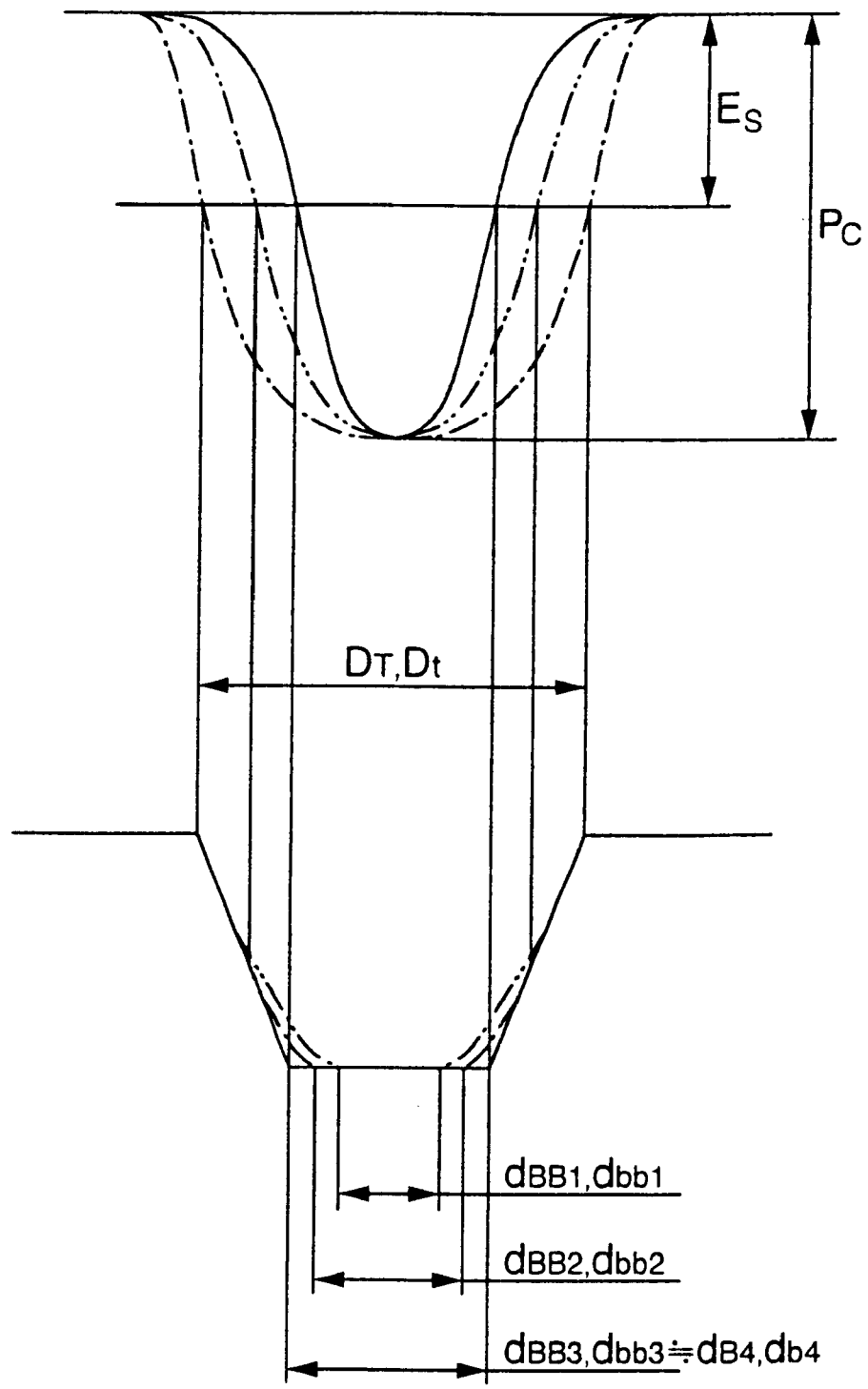
FIG. 6 is an enlarged cross sectional view of the formed hole in accordance with an embodiment of the present invention.
Figure 7:
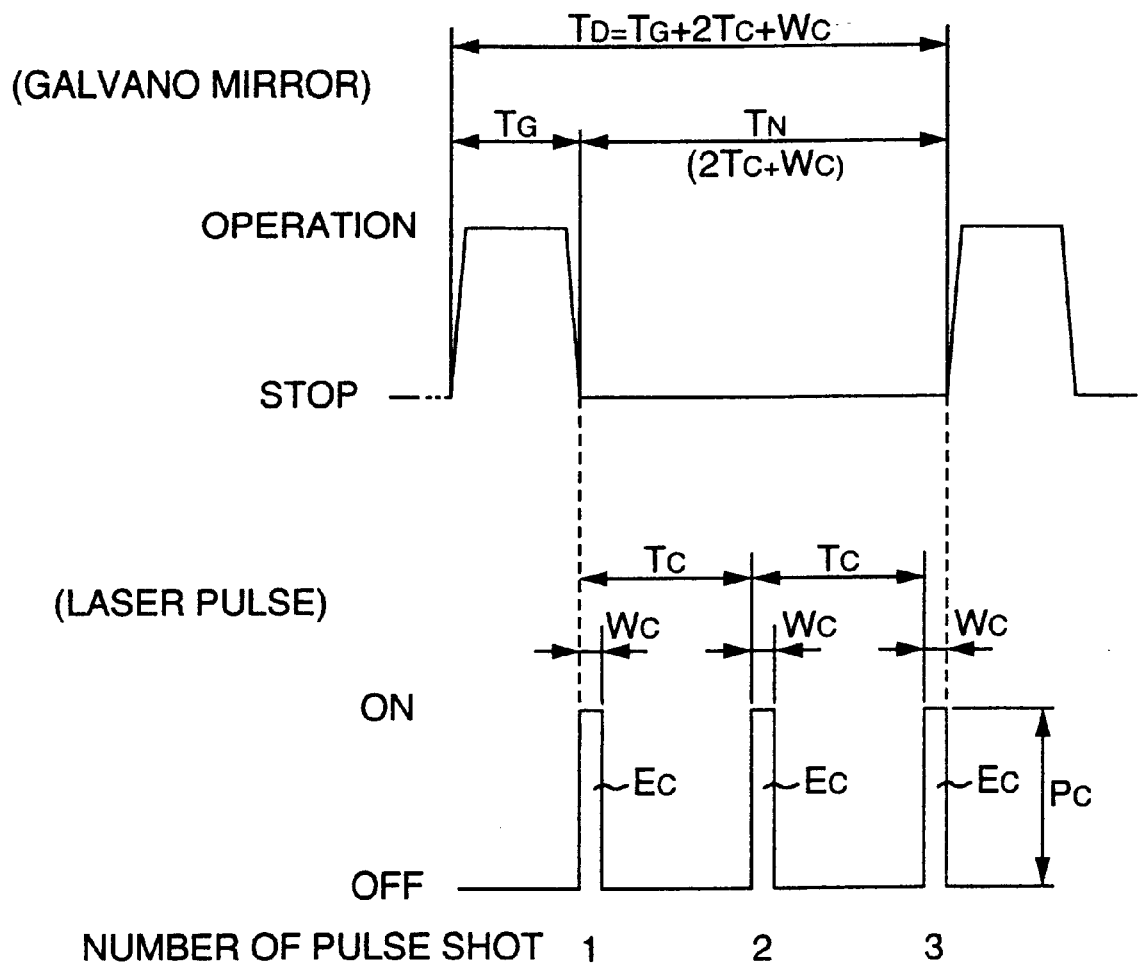
FIG. 7 is a view for explaining the operation of the conventional burst processing method.
Figure 8:
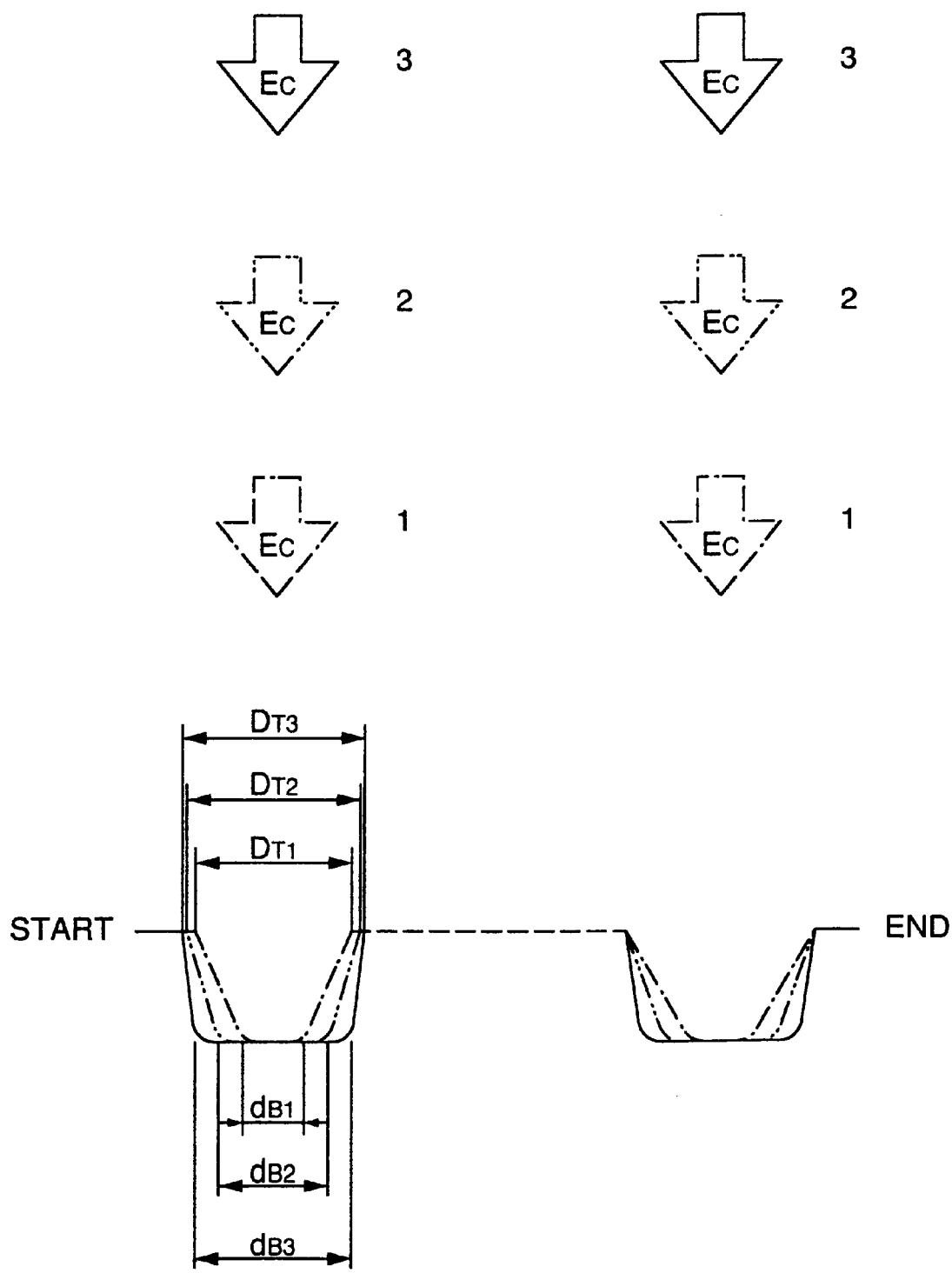
FIG. 8 is a cross sectional view of the formed hole in accordance with the conventional burst processing method.
Figure 9:
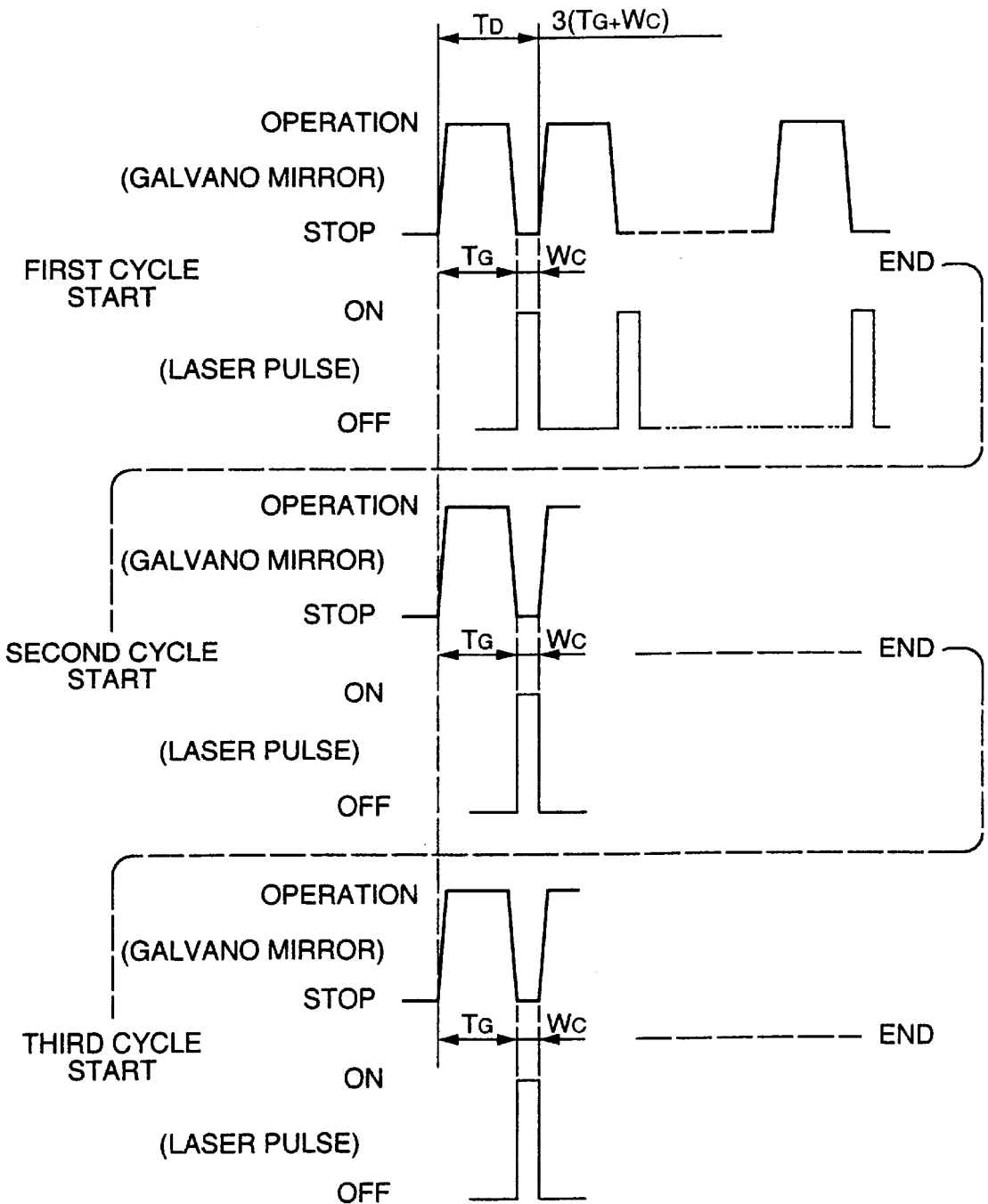
FIG. 9 is a view for explaining the operation of the conventional cycle processing method.
Figure 10:
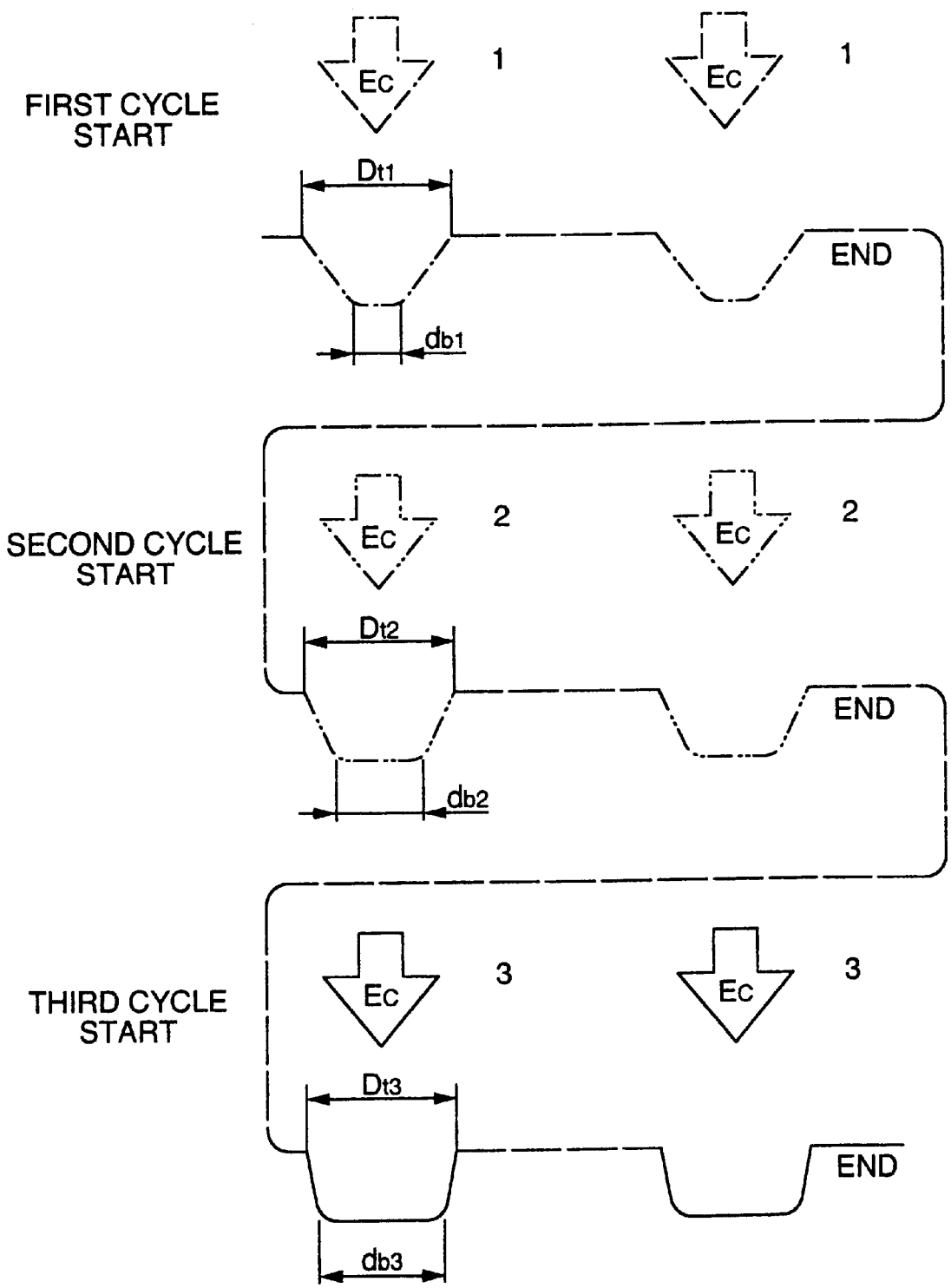
FIG. 10 is a cross sectional view of the formed hole in accordance with the conventional cycle processing method.
Figure 11:
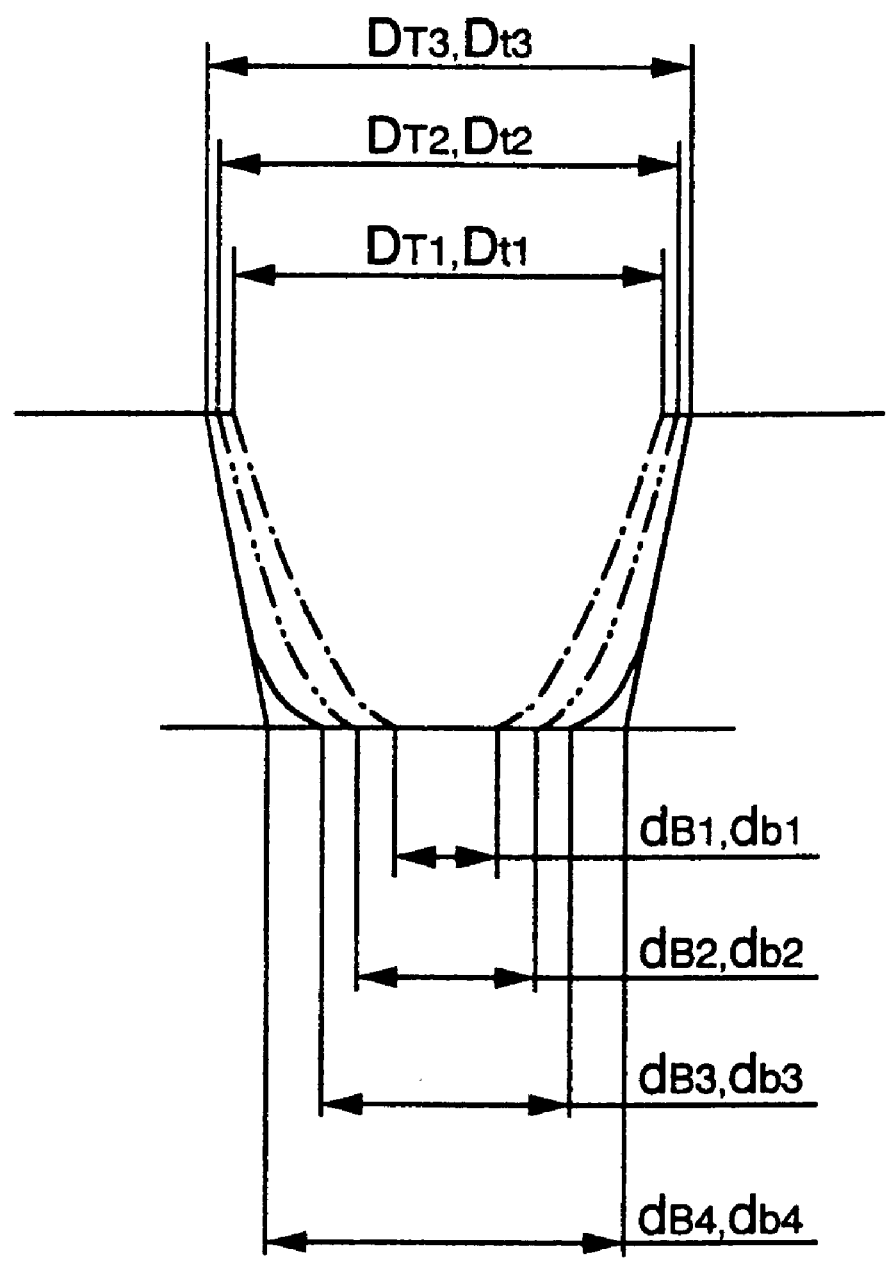
FIG. 11 is an enlarged cross sectional view of the conventional formed hole.

FIG. 6 is an enlarged view of a processing result in accordance with the present invention. Here, this drawing shows a case that the pulse width which is conventionally fixed to 15 $\mu$s is changed so that $W_{11}$, (or $W_{21}$) is 0.025 ms (that is, 25 $\mu$s, in which an aim is preferably 1.5 to 2.5 times the conventional one), $W_{12}$ (or $W_{22}$) is 0.012 ms (that is, 12 $\mu$s, in which an aim is preferably 0.5 to 1 times the conventional one), and $W_{13}$ (or $W_{23}$) is 0.008 ms (that is, 8 $\mu$s, in which an aim is preferably 0.3 to 0.7 times the conventional one), respectively.

As is apparent from the drawing, in the first condition, since the energy is consumed for decomposing the material if the high level energy, which is sufficient for reaching the hole bottom, with the longer pulse width than the conventional one is input, a thermal influence to the hole inlet and the hole wall surface is small and an influence to the hole quality and a hole shape is small. Further, in the second condition and the later, it is possible to expand the hole bottom area without damaging the hole inlet and the hole wall surface by setting the pulse width shorter than the conventional one, so that the resin is not carbonized and the inner layer copper foil is not damaged. This is because the vertical mode mainly constituted by the oscillation frequency does not change but horizontal mode corresponding to the spatial strength distribution changes when changing the pulse width while fixing the peak output $P_C$, that is, the beam diameter becomes narrow. Accordingly, it is possible to remove the projection portion left under the first pulse condition or the second pulse condition by processing in accordance with the second pulse condition and the third pulse condition. As a result, it is possible to control the shape of the hole so as to become an intended shape. Further, these tendencies are stable in comparison with the conventional pulse width fixed method even when changing the pulse period, and the influence to the hole shape and the hole quality is small even when making the pulse frequency short. Accordingly, it is possible to apply the minimum pulse period 0.5 ms (2000 Hz) of the oscillator. That is, when setting the practical positioning period of the galvano mirror to 2 ms (500 Hz), it is possible to realize the hole making period 3.02 ms (namely, the hole making speed 331 holes per second), and it is possible to process at a speed twice the conventional speed mentioned above.

In accordance with the present invention, the laser energy per one pulse of the second condition and the third condition is sufficiently smaller than the laser energy per one pulse of the first condition.

Moreover, although the step performing only the burst process or only the cycle process is shown in the above, for example, after performing the cycle processing under the first condition, each hole may be processed by the burst processing under the second condition and the third condition, or after performing the cycle processing under the first condition and the second condition, each hole may be processed by the burst processing under the third condition. Accordingly, it is possible to make the quality of the hole more excellent than that obtained by the cycle process and reduce the processing time.

Further, an acousto-optical device may be disposed within the path from the laser oscillator to the galvano mirror, for example, so as to control the pulse waveform.

As mentioned above, according to the present invention, in both cases of the burst method and the cycle method, one hole is formed while gradually reducing the pulse width of the laser. That is, the shape of the hole is almost formed under the first condition and the shape of the bottom portion is finished only by the processes under the second condition and the third condition, whereby it is possible to form an intended hole shape.

What is claimed is:

1. A method of making a hole in a printed circuit board by irradiating a laser beam, comprising a first step of forming a hole having a bottom;

a second step of expanding a bottom diameter of the hole bottom;

a third step of finishing an end portion of the hole bottom; and a fourth step of varying a pulse width of the laser beam while maintaining a peak output value of the laser beam so that an amount of laser beam energy in each of the first, second and third steps is different from each other.

2. The method of making a hole in a printed circuit board as claimed in claim 1, wherein the amount of laser beam energy emitted in the second step is smaller than that in the first step, and the amount of laser beam energy emitted in the third step is smaller than that in the second step.

3. The method of making a hole in a printed circuit board as claimed in claim 1, wherein the cycle processing is performed in the first step or in the first and second steps, and the burst processing is performed at least in the third step.

* * * * *